United States Patent [19]
Ozias

[11] Patent Number: 5,096,534
[45] Date of Patent: Mar. 17, 1992

[54] METHOD FOR IMPROVING THE REACTANT GAS FLOW IN A REACTION CHAMBER

[75] Inventor: Albert E. Ozias, Aumsville, Oreg.

[73] Assignee: Epsilon Technology, Inc., Tempe, Ariz.

[21] Appl. No.: 329,778

[22] Filed: Mar. 28, 1989

Related U.S. Application Data

[62] Division of Ser. No. 65,945, Jun. 24, 1987, Pat. No. 4,846,102.

[51] Int. Cl.$^5$ ............... C30B 35/00; C30B 23/04; C30B 25/14
[52] U.S. Cl. .................. 156/611; 156/610; 156/612; 118/730; 422/245; 427/255.5
[58] Field of Search ......... 422/245, 246, 247; 118/715, 725, 729, 730; 427/255.1, 255.2, 255.5; 156/610, 612, 613, 614

[56] References Cited

U.S. PATENT DOCUMENTS

| | | | |
|---|---|---|---|
| 3,981,791 | 9/1976 | Rosvold | 118/730 |
| 4,284,033 | 8/1981 | del Rio | 118/730 |
| 4,714,594 | 12/1987 | Mircea | 427/255.5 |
| 4,800,105 | 1/1989 | Nakayama et al. | 427/255.2 |
| 4,839,312 | 6/1989 | Ovshinksy et al. | 427/255.2 |

*Primary Examiner*—Gary P. Straub
*Attorney, Agent, or Firm*—Cahill, Sutton & Thomas

[57] ABSTRACT

An epitaxial deposition method for processing a single wafer and a reaction chamber for conducting the method. The chamber has a substantially rectangular cross section reduced for increased system efficiency. Because the reduced cross section has insufficient room for a susceptor, the susceptor, in one embodiment, is mounted within a second portion of a dual height chamber having a greater cross sectional area. Purge gas supplied through an aperture in the chamber prevents undesirable deposits beneath the susceptor from reactant gas. The velocity profile and flow of reactant gas beneath the susceptor are controlled, for example, by a quartz plate which narrows and simultaneously shapes the gap between the susceptor and the input end of the chamber. Two types of reactant gas injectors can be used for controlling the velocity profile of injected gases.

3 Claims, 4 Drawing Sheets

METHOD FOR IMPROVING THE REACTANT GAS FLOW IN A REACTION CHAMBER

This is a division of application Ser. No. 065,945, filed June 24, 1987, now U.S. Pat. No. 4,846,102.

BACKGROUND OF THE INVENTION

1. Field of the Invention

The present invention relates generally to improved reaction chambers for use in Chemical Vapor Deposition (CVD) systems, and more particularly to improvements in reaction chambers for use in epitaxial deposition systems for processing wafers on a one-at-a-time basis and for providing a more efficient deposition, a more uniform deposition on the substrate or wafer to be processed, and for reducing or eliminating deposits beneath the susceptor.

2. Description of the Prior Art

Chemical Vapor Deposition (CVD) is the formation of a stable compound on a heated substrate by the thermal reaction or decomposition of certain gaseous compounds. Epitaxial growth is a highly specific type of CVD that requires that the crystal structure of the substrate or wafer be continued through the deposited layer.

Chemical Vapor Deposition systems take many forms but the basic components of any CVD system usually include a reaction chamber which houses the wafer(s) to be processed, a gas control section, a timing and sequence control section, a heat source, and an effluent handling component. A great variety of ways of implementing each of these components leads to a great number of individual reactor configurations in prior art systems.

The purpose of the reaction chamber is to provide a controlled environment for the safe deposition of stable compounds. The chamber boundary may be quartz, stainless steel, aluminum or even a blanket of a non-reacting gas, for example, nitrogen. Commercial epitaxial deposition (epi) reaction chambers are generally classified as being one of the following three general types, depending primarily upon gas flow. Horizontal systems are employed wherein the wafers are placed horizontally on a boat or susceptor and the gas flows horizontally in one end of the reaction chamber, across the wafers, and out the other end. In vertical systems, the wafers are placed horizontally on a susceptor with the gas flow vertically toward the wafers from the top and the susceptor is normally rotated to provide more uniform temperature and gas distributions. In cylindrical or barrel reactor systems, the wafers are placed vertically on the outer surface of a cylinder, and the gases flow vertically into the chamber from the top and pass over the wafers on the susceptor which rotates for uniformity of deposition.

Heating in a cold-wall CVD system is accomplished through the use of radio frequency (RF) energy, or by radiation energy commonly in the ultraviolet (UV), visible, or infrared (IR) bands or by resistance heating. In an RF heated susceptor, the energy in an RF coil is coupled into a silicon carbide coated carbon susceptor. The wafers are heated through their contact with the susceptor. Radiant UV or IR heating is accomplished by the use of high intensity lamps that emit strongly in the ultraviolet, visible, and/or infrared spectrum. The large amounts of energy from these lamps heat the wafers and their holders by radiation. In both types of cold-wall heating, the walls of the chamber are cold, in comparison to the wafers themselves. The chamber walls must be cooled to prevent radiation from the lamps and the susceptor from producing a large temperature rise.

The reaction chamber is used in epitaxial deposition systems to provide the carefully controlled environment needed for the epitaxial deposition to take place is a critical component of the epitaxial reactor. Three basic reactor chamber configurations are used in the semiconductor processing industry including the horizontal reactor, the vertical reactor, and the barrel reactor, all of which where previously described herein.

Prior to reactor heat-up, any residual air that remains in the chamber must be removed or purged. Prior to cool-down, following the deposition cycle, any gases remaining from the growth process are flushed out.

The various gases used in an epitaxial reaction chamber include a non-reactive "purge" gas which is used at the start and end of each deposition if the reaction chamber is opened to the atmosphere after every run as is normally done. The non-reactive purge gas, usually nitrogen, is used to flush unwanted gases from the reaction chamber.

A carrier gas is used before, during, and after the actual growth cycle. The carrier gas is mixed with the gases responsible for etching, growth, or doping the silicon as each is added. Hydrogen is most often used as a carrier gas, although helium is sometimes employed.

Etching gases may be used prior to the actual epitaxial deposition wherein etching is performed to remove a thin layer of silicon from the surface of the wafer together with any foreign matter or crystal damage that is present on it. The etching prepares atomic sites for nucleating or initiating the epitaxial deposition process.

The carrier gas is normally hydrogen. The source gases for silicon conventionally used for epitaxial depositions include Silane ($SiH_4$); Dichlorosilane ($SiH_2Cl_2$); Trichlorosilane ($SiHCl_3$); and Silicon tetrachloride ($SiCl_4$). The dopant gases normally used in epitaxial deposition include Arsine ($AsH_3$); Phosphine ($PH_3$); and Diborane ($B_2H_6$). The etching gas is commonly HCl.

The problems inherent in all prior art systems of Chemical Vapor Deposition, and more particularly in the epitaxial deposition systems, include the non-uniform deposition on the surface of the wafer to be processed; the presence of contaminants in the reaction chamber prior to processing; wall deposits formed on the interior walls of the reactor chamber; deposition of the reactant chemicals on the heated susceptor and its support structure; inefficient gas flow characteristics; slow processing times; and non-uniform depositions due to uncontrolled gas velocity profiles or gas density profiles.

These problems become even more inportant with the modern trend away from batch processing systems toward single wafer or one-substrate-at-a-time processes. In a single wafer-at-a-time processing system, the same volume of gas normally flowing through a reaction chamber with many wafers to be processed cannot be used since too much reactant gas will be consumed for one wafer. Still further, the cycle times to process a batch of wafers in a conventional batch processing system are far too long for single wafer processing. A single wafer process requires a more rapid deposition rate to minimize the cycle time. Within a single wafer system, the deposits from reaction by-products build-up far more rapidly on a per wafer basis than in batch processing systems. Customers are increasingly demanding reduced particulate contamination. As a result, these deposits must be controlled or minimized in order to reduce the particulate contamination.

These and other objects and advantages of the present invention will be more fully understood after reading the Detailed Description of the Preferred Embodiments of the present invention, the Claims, and the Drawings which are briefly described hereinbelow.

SUMMARY OF THE INVENTION

It is an object of the present invention to provide an improved reaction chamber apparatus for use in CVD processing single substrates or wafers on a one-at-a-time basis.

It is another object of the present invention to provide an improved single wafer reaction chamber apparatus for use in epitaxial deposition.

It is yet another object of this invention to provide an improved single wafer reaction chamber apparatus for use in a single wafer CVD system which controls the reactant gas velocity profile to insure uniform depositions.

It is a further object to provide an improved single wafer CVD reaction chamber for producing more uniform deposition than were heretofore possible.

It is still a further object of this invention to provide an improved single wafer CVD reaction chamber with a relatively fast processing time without wasting reactant gases.

It is yet a further object to provide an improved single wafer CVD reaction chamber which aids in substantially reduces deposits beneath the susceptor.

It is still another object to provide an improved reaction chamber apparatus for use in a single wafer epitaxial deposition system including a method and apparatus for increasing system efficiency by reducing carrier gas flow consumed on a per wafer basis.

The present invention provides an improved reaction chamber for us in a CVD system, and more particularly, for use in an improved single wafer epitaxial deposition system for processing a single wafer-at-a-time with greatly improved efficiency. The system of the present invention includes a reaction chamber having a top plate, a bottom plate parallel to the top plate, sides joining the top and bottom plate, a hollow interior with a generally rectangular cross-section, a reactant gas inlet at one end of the hollow interior of the reaction chamber and a gas outlet at the opposite end of the hollow interior of the reaction chamber for exhausting the at least partially spent gases therefrom.

In one embodiment of the improved epitaxial deposition reactor chamber of the present invention, an aperture is provided or formed in an intermediate portion of the bottom panel of the reaction chamber, and a well having a hollow interior cavity is connected with its open end coterminous with the aperture and the remaining portion of the well distending vertically downwardly therefrom. A susceptor support means is housed at least partially within the well for positioning a susceptor for demountably carrying or positioning a semiconductor wafer or substrate to be processed within the circular aperture in the bottom panel of the reaction chamber and either slightly above or slightly below the plane of the bottom panel, as desired. In this embodiment, the use of the well for positioning the susceptor enables the height which is measured as the vertical distance between the top panel and the bottom panel to be substantially reduced to approximately one half of its normal height for providing a reduced cross-sectional area. The reduced cross-sectional area of the hollow interior of the reaction chamber enables the velocity of the reactant gases, which are supplied at a uniform flow rate, to be greatly increased and in fact doubled, so as to greatly reduce the processing time required for an epitaxial deposition operation. Conversely, for a given flow rate, the reduced area results in reduced total gas flow per unit time or per wafer processed.

Normally, reducing the distance between the top and bottom panels is known in the prior art to increase the undesirable wall deposits thereon. However, the present invention reduces the height while simultaneously reducing wall deposits downstream of the susceptor between the susceptor and the gas outlet end of the reaction chamber, as hereinafter described.

In an alternate embodiment of the epitaxial deposition reaction chamber of the present invention, a chamber is provided which has a first bottom panel disposed between the reactant gas input end of chamber and an intermediate portion of the hollow interior of the chamber. A second substantially lower bottom panel is disposed between the intermediate portion of the chamber and the exhaust end thereof. An inwardly curved vertical wall is used to interconnect the first bottom panel with the second or lower bottom panel to provide a dual height reaction chamber. The first height is significantly reduced between the top panel and the bottom panel for decreasing the cross-sectional area thereby greatly increasing the gas flow velocity of the reactant gas for reducing the time required for the deposition operation and greatly reducing the amount of used gases. The lower portion of the chamber has a height which is approximately twice the height of the input end of the chamber, so that it is able to house the susceptor and means for supporting the susceptor within the chamber, and so that it provided ready access to the susceptor and its support structure.

Each of the reaction chamber embodiments can include a quartz bib having an inwardly curved end portion extending partially over the central aperture or inwardly curved vertical wall to overhang the lower panel and at least partially encircle a portion of the circumference of the susceptor for providing a narrow gap therebetween. The inwardly curved portion can be shaped or sized to significantly narrow the gap at the center along the longitudinal axis of the reaction chamber to and widen the gap in both directions toward the sides of the chamber for shaping the velocity profile to a predetermined desired profile for optimizing the uniformity of the deposition on the wafer.

Similarly, instead of quartz plate laying over the input end of the bottom panel, the bottom panel can be extended horizontally rearwardly to provide the identical effect.

These and other objects and advantages of the present invention will be more fully understood after reading the Detailed Description of the Preferred Embodiments of the present invention, the claims, and the Drawings which are briefly described hereinbelow.

DETAILED DESCRIPTION OF THE PREFERRED EMBODIMENTS

Figure 1:
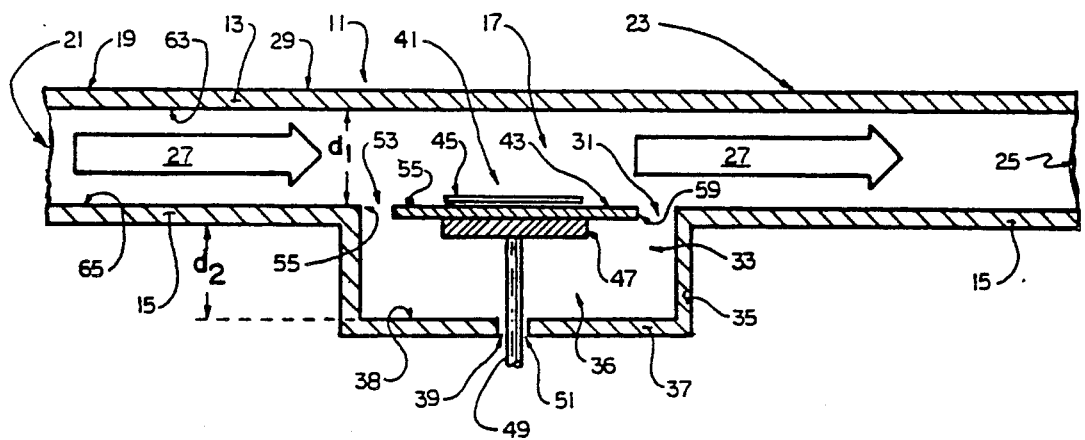
FIG. 1 is a cross-sectional view of the preferred embodiment of the epitaxial deposition reaction chamber of the present invention.

FIG. 1 shows a sectional side view of the preferred embodiment of the epitaxial deposition reaction chamber of the present invention which is referred to herein as the "reduced area"; deep well" reaction chamber 11. The reaction chamber 11 is shown as including a top panel 13 and a bottom panel 15. Each of the panels 13 and 15 is an elongated, generally rectangular, substantially planar quartz panel which is substantially transparent to visible and shorter wavelength radiation in a predetermined frequency range for producing a "cold-wall" reactor while enabling the radiation to penetrate to the hollow interior 17 of the reaction chamber 11. The chamber 11 further includes a front end 19 having a reactant gas input 21 and a rear end 23 having a spent gas output 25. The gas flow at the input end 19 of the reaction chamber 11 is indicated by the gas flow direction arrow 27.

In an intermediate portion 29 of the hollow interior 17 of the reaction chamber 11, a circular aperture 31 is disposed in the lateral center of the bottom panel 15. A cylindrical well 33 operably distends substantially vertically downward from the bottom panel 15 at the outer peripheral edge of the circular aperture 31. The well 33 includes cylindrical walls 35, a circular well bottom, floor or base 37, and a hollow interior or well cavity 36 formed interiorly of the cylindrical walls 35 and the well bottom 37. A circular aperture or base aperture 39 is formed in the center of the bottom 37 of the well 33. Positioned above the center of the base aperture 39 within the top portion of the well cavity 36 and at least partially within the circular base aperture 31; a susceptor assembly 41 is housed. The assembly 41 includes a susceptor 43 having a planar top surface 55 for demountably positioning or carrying one substrate or wafer 45 to be processed. The susceptor 45 may be supported by support apparatus including a pedestal 47, and a shaft 49 distending vertically downwardly from the center bottom portion of the pedestal 47. The shaft 49 passes through the center of the hollow cavity 36 of the well 33 and through the base aperture 39 for connection to drive means positioned therebelow, as hereinafter described. A gasket or seal member may be positioned within the base aperture 39 about the shaft 49 for sealing purposes, and conventional bearings may also be used.

An annular gap 53 is formed within the outer peripheral portion of the circular aperture 31 between the outer peripheral, rim, edge, or circumference 59 of the susceptor 43 and the upper lip 55 of the well 33 where the bottom plate 15 meets the vertically disposed cylindrical well wall 35.

The reactant gases flow through the intermediate portion 29 of the reaction chamber 11 and a major portion of the reactant gas flow passes over the top surface of the wafer 45 to be processed while some portion (not shown) attempts to pass downwardly through the gap 53 and into the hollow interior 36 of the well 33 in the area beneath the susceptor 43. Any reactant gas passing through the annular gap 53 can form undesirable chemical coatings or deposits on the heated undersurface of the susceptor 43 and its support structure 47, 49, the interior 36 of the well 33, and the like, and these deposits may cause contamination problems, loss of time for cleaning, greatly reduced efficiency of the system, etc.

The vertical distance or height "$d_1$" measured between the interior surface 63 of the top panel 13 and the interior surface 65 of the bottom panel 15 is approximately one half of the distance previously used in the prior art systems. Reducing the height of at least the input portion of the reaction chamber 19 simultaneously reduces the cross-sectional area of the hollow interior 17 thereof.

The reduction of the height "d" to the distance "$d_1$" would normally prevent the reaction chamber 11 from being able to house the susceptor assembly as required therein. Therefore, the provision of the well 33 provides the additional space required for housing the susceptor 43 within the well 33 and at least partially within the circular aperture 31 of the bottom panel 15 for positioning the susceptor 43 and the wafer 45 demountably positioned thereon at least one of coplanar with the plane of the bottom surface 17 or slightly vertically disposed above said plane, in order to obtain an optimal deposition on the wafer 45. The height or depth of the well 33 is given by "$d_2$" and this dimension is approximately equal to or slightly greater than the height "$d_1$".

The purpose of the reduced area input portions of the first embodiment of the reaction chamber 11 and the alternate embodiment of the reaction chamber 81 (as hereinafter described) is to reduce the gas flow required for a given deposit. The embodiment of the reaction chamber 11 of FIG. 1 reduces the gas flow required for a given deposition by a factor of approximately one half or more. Assuming the $d_2$ is slightly greater than $d_1$, even greater efficiencies can be realized. In order to control wall deposits in order to reduce the negative impact of the throughput by reducing the volume of the input area of the quartz tubes.

Figure 2:
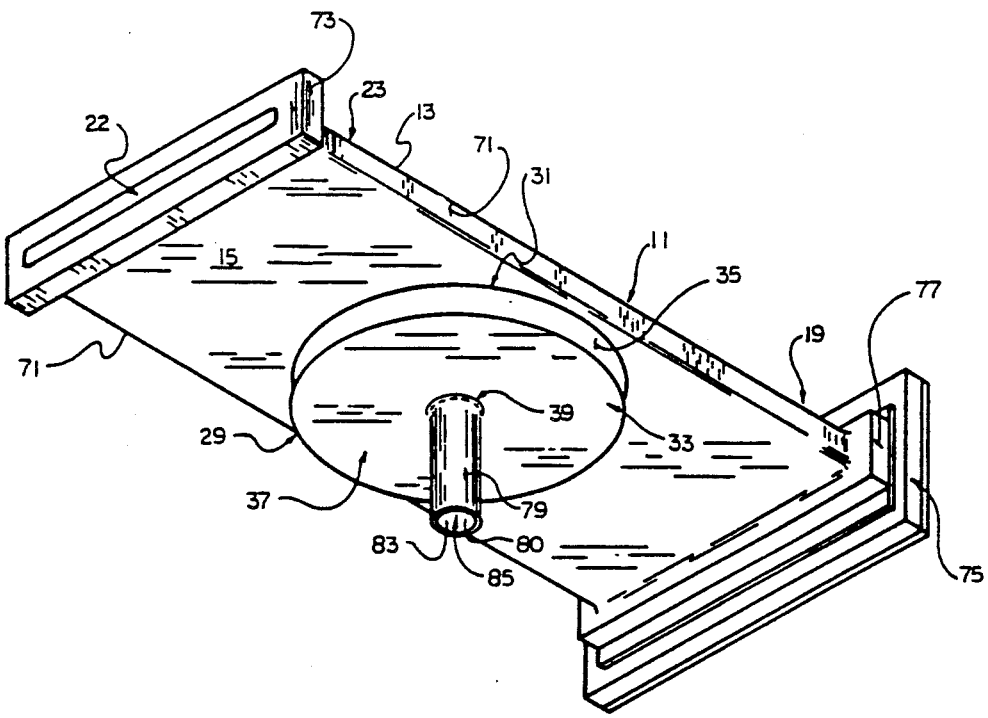
FIG. 2 shows a partial perspective view of the epitaxial deposition reaction chamber of the embodiment of FIG. 3.

FIG. 2 shows a perspective view of the reaction chamber 11 of the preferred embodiment of the present invention of FIG. 1. The reaction chamber 11 is shown as including a top panel 13 and a bottom panel 15. A pair of sides 71 are shown as interconnecting the edges of the top and bottom panels 13 and 15 to form an elongated, box-like construction having a rectangular cross-section and a generally hollow interior. The front end 19 of the reaction chamber 11 is shown as including a flange portion 77. The flange 77 is positioned adjacent a combination gate and reactant gas injector port 75, as hereinafter described. The opposite or rear end 23 of the reaction chamber 11 is shown as including a flange 73 surrounding a spent gas outlet 22 for exhausting the at least partially spent gases from within the hollow interior of the chamber 17.

The reaction chamber 11 is shown as having a circular aperture 31 disposed within an intermediate portion 29 of the floor 15 of the chamber 11, and a well 33 has its top opening coincident with the aperture 31. The well 33 has a generally cylindrical wall 35 depending substantially vertically therefrom and extending downward to terminate in a circular well floor or base 37. The plane of the base 37 is substantially parallel to the plane of the bottom panel 15, and the height of the well "$d_2$" is approximately equal to or slightly greater than the height of the chamber, measured as the perpendicular distance between the planes of the top panel 13 and the bottom panel 15. The base 37 of the well 33 includes a central base aperture 39 which has, distending vertically downwardly therefrom, an elongated hollow tube 79 having cylindrical walls 80, a hollow interior 83, and a purge gas inlet 83.

Figure 3:
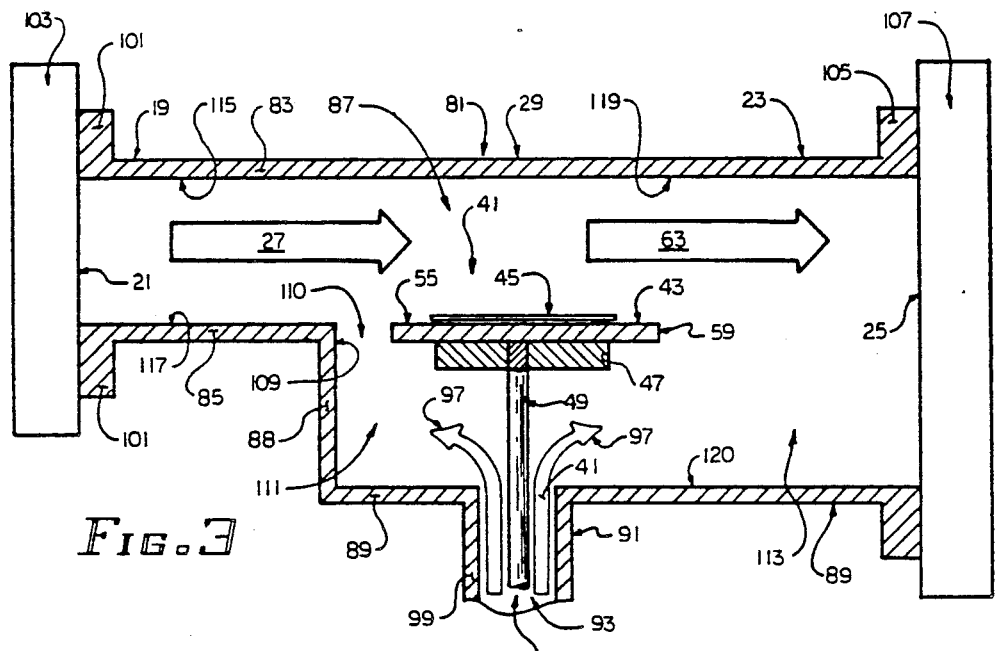
FIG. 3 illustrates a sectional side view of an alternate embodiment to the epitaxial deposition reaction chamber of FIG. 3.

FIG. 3 illustrates a second embodiment to the epitaxial deposition reaction chamber 11 previously described. In FIG. 3, the reaction chamber 81 is generally referred to as a "dual height" reaction chamber. The chamber 81 has a top panel 83 which is an elongated, generally rectangular, substantially planar, quartz panel which is transparent to higher frequency radiant energy so as to form a cold-wall reactor whose walls are transparent to heat energy in a predetermined frequency range so that the walls remain cool while any absorbing material such as the susceptor and wafer in the hollow interior 87 of the reaction chamber 81 can be heated for facilitating the deposition reaction. The reaction chamber 81 also includes a first or front bottom panel 85 disposed between the front end 19 of the reaction chamber 81 and an intermediate portion 29 thereof. A vertical wall 87 depends substantially vertically downward from the end of the first or front bottom panel 85 and terminates in a second or rear bottom panel 89 which is an elongated, generally rectangular, substantially planar, quartz panel.

A circular aperture 41 is formed in an intermediate portion 29 of the second bottom panel 89. A hollow tubular element 91 depends vertically downward therefrom, and a shaft 49 depends vertically downward through the hollow interior 93 of the tube 91 along the longitudinal axis thereof. Purge gas is supplied to an inlet 95 in the tube 91 and the purge gas is supplied to the hollow interior 93 bounded by tube walls 99 of the tube 91 and then into the lower hollow interior portion 111 of the reactor 81 via the bottom circular aperture 41. The purge gas flow is shown by the purge gas flow direction arrows 97 and, the purge gas works exactly the same as the purge gas usage previously described with reference to the preferred embodiment of the reaction chamber 61 of the present invention. The shaft 49 is shown as supporting the pedestal 47 which in turn supports the susceptor 43 which demountably carries or positions a wafer 45 thereon.

The front end 19 of the reaction chamber 81 of FIG. 3 is shown as including flange members 101 and a reactant gas injector port and gate assembly 103 is mounted in abutting relationship to the flange member 101 for injecting reactant gases into the input 21 of the reaction chamber 81. Similarly, the rear 23 of the reaction chamber 81 includes flanges 105 and a spent gas output port and gate assembly 107 having a spent gas outlet 25. Furthermore, the beginning of the vertical wall 87 at the junction of the first floor or bottom wall 85 is referred to as the lip 109 and the area between the lip 109 and the outer peripheral circumference, rim or edge 59 of the susceptor 45 defines a gap 110 therebetween. The gap 110 connects the hollow interior 87 of the front end 19 of the reaction chamber 81 with the hollow interior 111 beneath the susceptor assembly 43 and the hollow interior 113 of the intermediate portion 29 and rear portion 23 of the reaction chamber 81.

Figure 4:
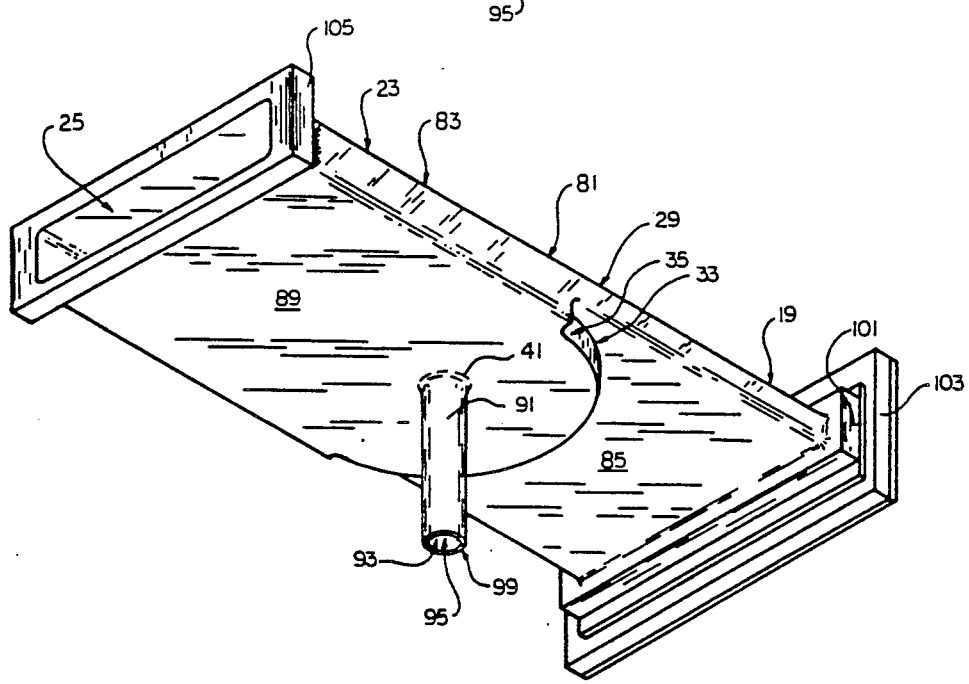
FIG. 4 is a partial perspective view of the embodiment of the epitaxial deposition reaction chamber of FIG. 11.

FIG. 4 represents a perspective view of the dual height epitaxial deposition reaction chamber 81 of the alternate embodiment of the present invention. In FIG. 4, the reaction chamber 81 is shown as having a top panel 83, a first or front bottom panel 85 and a second or rear bottom panel 89. The vertical height between the top panel 83 and the rear bottom panel 89 is approximately equal to or slightly greater than twice the height of the input end of the reactor 81 measured as the perpendicular distance between the inside surface 115 of the top panel 83 the inside surface 117 of the front bottom panel 85 of FIG. 3.

The front end 19 of the reaction chamber 87 is shown as terminating in a flange 101 positioned in a cooperating relationship with an input gate and reactant gas injector 103. The rear end 23 of the reaction chamber 81 includes a flange 105 surrounding a gas outlet 25 for exhausting the at least partially expended, reacted, or spent reactant gases from the hollow interior 17 of the reaction chamber 81. The front bottom panel 85 is shown as terminating in a curved vertical wall portion 35 whose bottom portion terminates the front end portion 19 and of the front bottom panel 85. The height of the rear end portion of the reaction chamber 81, as measured between the inside surface 119 of the top panel and the inside surface 120 of its rear bottom panel 89 is equal to or slightly greater than twice the height of the front end portion 19 of the reactor 81 as measured between the inside surfaces 119, 120 of the top 83 and the second lower panel 89.

An intermediate portion 29 of the rear bottom panel 89 includes a circular aperture 41 communicating with the top opening in a hollow cylindrical tube 91 distending vertically downwardly from the bottom surface of the second bottom panel 89 and including a hollow interior 93 surrounded by wall 99 and a purge gas inlet 95 disposed therein for supplying purge gas to the hollow interior of the reaction chamber 81, as previously described.

Figure 5:
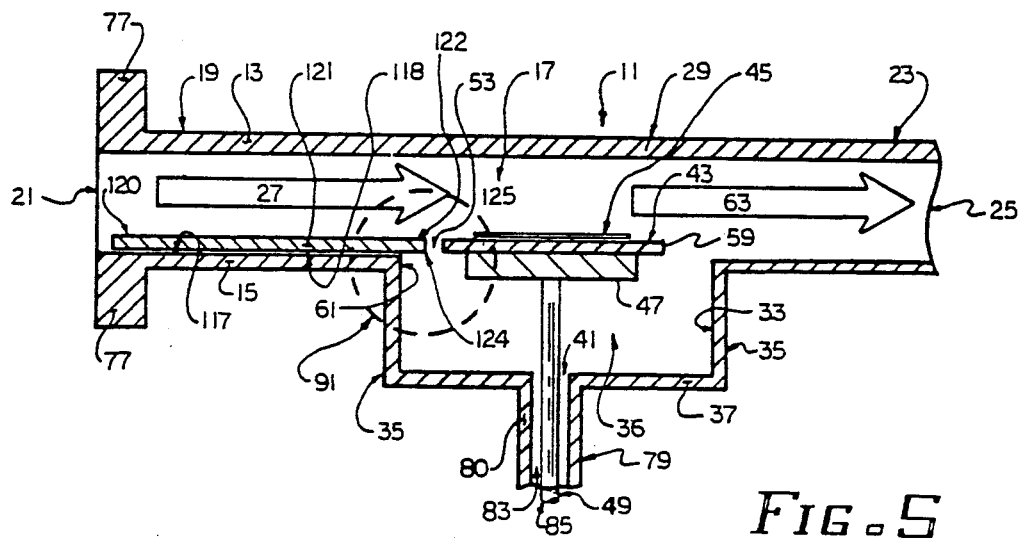
FIG. 5 is a partial sectional side view of the input end of an epitaxial deposition reaction chamber showing a quartz bib disposed on the bottom panel adjacent the outer periphery of the susceptor.

FIG. 5 illustrates yet another embodiment of the improved epitaxial deposition reaction chamber 11 of the present invention which includes further means for improving the deposition process while eliminating or at least significantly reducing undesirable chemical deposits beneath the susceptor 43 and within the well 33, as previously described. In FIG. 5, the reduced area deep well reaction chamber 11 is shown as previously described in FIG. 1, and like reference numbers designate like components, as known in the art, except that a bib or quartz plate 121 is disposed with its bottom surface 118 on the interior surface 117 of the bottom panel 15 between the front end 19 and the susceptor 43. The plate 121 is shown as including an extension portion 122 which extends past or beyond the lip 61 of the well 33 so that the gap 53 of FIGS. 1 and 2 is substantially reduced to a relatively narrower gap 125 disposed between the rear edge or end portion 124 of the plate 121 and the outer peripheral rim or circumference 59 of the susceptor 43. The reduced area gap 125 further restricts the ability of the reactant gas 27 to pass through the reduced area gap 125 and beneath the susceptor 43 to form undesirable deposits thereon. The plate 121 is a separate piece of quartz material and will be further described hereinafter.

Figures 6, 7:
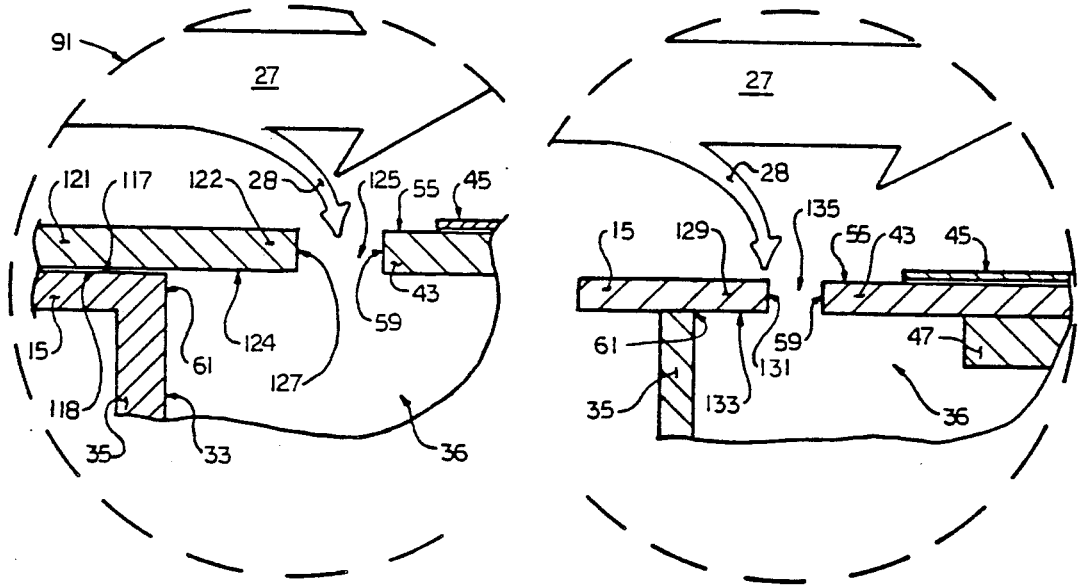
FIG. 6 is a blow-up of the circled portion of FIG. 5 showing the detail in the gap area.
FIG. 7 is a blow-up of the circled portion of FIG. 5 showing an alternate embodiment to the quartz plate thereof.

FIG. 6 represents the dotted circle 91 of FIG. 5 and illustrates a portion of the apparatus of the system of FIG. 5 in greater detail. In FIG. 6, the flow arrow 27 illustrates that the reactant gas is passing over the wafer 47 and the bifurcated arrow 28 illustrates that a small portion of the reactant gas is passing through the narrowed gap 125 into the area 36 beneath the susceptor 43 and its support components. This reactant gas 28 causes undesirable deposits beneath the susceptor and on the support components which can result in contamination of the wafer 45. The quartz plate or bib 121 is shown as having its lower surface 118 operatively supported on the upper interior surface 117 of the lower wall 15. The wall 15 terminates in the vertical distending wall 35 of the well 33 and the area of intersection of the upper surface 117 of the lower wall 15 and the interior surface of the well wall 35 is referred to by the reference numeral 61 designating the lip of the well 33. An extension portion or end portion 122 of the quartz plate 121 extends beyond the lip 61 and parallel to the inside surface of the floor 37 of the well 33 as previously described. The lower surface portion 124 of the extension portion 122 extends beyond the lip 61 and over the floor 37 of the well 33 while the outer end portion 127 represents the rear end portion of the plate 121. The outer peripheral circumference or rim 59 of the susceptor 43 is spaced a predetermined distance away from the outer end portion 124 of the plate 121 and a narrowed gap 125 exists therebetween. The gap 125 communicates with the hollow interior 36 within the well 33 as previously described.

Figure 8:
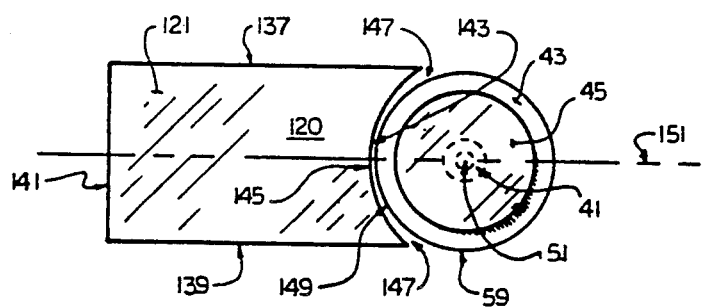
FIG. 8 shows a top view of the susceptor, wafer, and quartz plate of FIG. 5 illustrating the gap therebetween.

An alternate embodiment of the separate bib or quartz plate 81 is shown in FIG. 7. In FIG. 7, the individual plate 81 is replaced with an extension 129 of the bottom panel 15 of the reaction chamber 11. In FIG. 7, the extension 129 is shown as overhanging the lip 61 of the wall 35 of the well 33 since it extends radially inward over the entrance to the well as defined by the circular aperture 31 in the base 15, so that the point where the bottom surface 15 meets the cylindrical wall 35 of the well 33 is defined as the lip 61, and the extension or overhang 129 passes horizontally outwardly thereover and terminates in the rear end portion 131 having the identical structure to the end portion 122 of the plate 81 previously described with reference to FIG. 7. The result achieved by the embodiment of FIG. 7 is substantially identical to that achieved with FIGS. 5 and 6, and the gap 125 is narrowed to the reduced area gap 135 and shaped or dimensioned so as to have the narrowest gap portion 143 at the center and the widest gap portions 147 at the sides for reducing the chance of reactant gas flow into the area beneath the susceptor as shown in FIG. 8. The reduced gap 135 is wider than reduced gap 125 to compensate for increased heating of the plate or bib 121 from the susceptor 45 in the area which is further downstream.

FIG. 8 shows a top view of the susceptor 45, wafer 47, and the bib or quartz plate 121 of FIG. 5. The plate 121 is shown as including a relatively straight front end 141 which is generally perpendicular to the longitudinal axis 151 of the reactor 11, a pair of generally parallel sides 137, 139 which are generally parallel to the longitudinal axis 151 and to the sides of the reactor 11 and perpendicular to the rear end 141, and a top planar surface 120. The sides 137, 139 are spaced a predetermined distance from the sides of the reactor chamber 11 or in an abutting relationship thereto, as desired. The rear end 143 of the plate 121 is inwardly curved at the front end so as to provide a relatively narrow gap 145 between the outer peripheral edge of the inwardly-curved end portion 143 and the outer peripheral rim or circumference 149 of the susceptor 43. The gap 145 between the inwardly curved rear end portion 143 and the outer peripheral rim or circumference 59 of the susceptor 43. The gap 145 between the inwardly curved rear end portion 143 and the outer peripheral edge 59 of the susceptor 43 which is at least partially encircled thereby is non-linear. The inwardly curved end portion 143 is shaped or designed so as to produce a relatively narrow gap 145 at the center of the plate 121 along the longitudinal axis 151 of the reaction chamber 11, and the gap 145 widens as the inwardly curved surface 143 at the rear end extends laterally outward from the longitudinal axis 151 towards the chamber sides so that the gap continues to widen until it reaches a maximum width 147 between the outer longitudinal end portions of the sides 137, 139 of the plate 121 and the outer peripheral rim 59 of the susceptor 45.

As can be seen in FIG. 8, the rearwardly extending ends of the sides 137, 139 forming the widest gap portions 147 and the wall 143 of the rear end portion 143 at least partially encircle a portion of the outer peripheral circumference 59 of the susceptor 45, and in fact, encircle nearly 180° of the circumference 59. Therefore, the gap 145, 147 extends almost 180° about the outer peripheral rim 149 of the susceptor 45 and continually widens as it goes laterally from the narrowest center gap portion 145 toward the widest side gap portions 147 on opposite sides of the outer peripheral rim 149 of the susceptor 45. The narrowing of the gap 145 along the longitudinal center line or axis 151 of the reactor 45 further reduces the chance of the reactant gas passing therethrough and forming undesirable deposits beneath the susceptor 45. Furthermore, the reduced area gap 145, 147 produces a positive effect on the reactant gas flow thereover. It serves to partially reshape the velocity profile of the gas passing thereover to insure the production of a more uniform deposition on the surface of the wafer 47.

Figure 9:
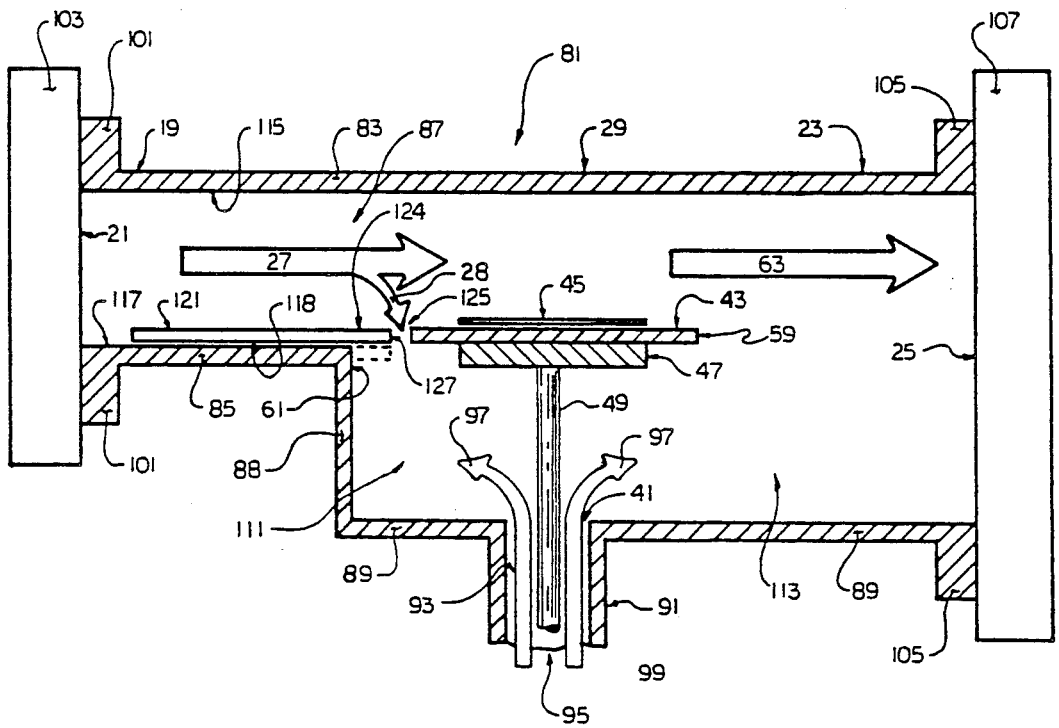
FIG. 9 is a partial sectional side view of the input end of the dual height epitaxial deposition reaction chamber of FIGS. 3 and 4 showing a quartz plate therein.

FIG. 9 illustrates a second embodiment to the epitaxial deposition reaction chamber 11 previously described. In FIG. 9, the reaction chamber 81 is generally referred to as a "dual height" reaction chamber. The chamber 81 has a top panel 83 which is an elongated, generally rectangular, substantially planar, quartz panel which is transparent to ultraviolet energy so as to form a cold-wall reactor whose walls are transparent to heat energy in a predetermined frequency range so that the walls remain cool while the interior 87 of the reaction chamber 81 is heated for facilitating the deposition reaction. The reaction chamber 81 also includes a first or front bottom panel 85 disposed between the front end 19 of the reaction chamber 81 and an intermediate portion 29 thereof. A vertical wall 87 depends substantially vertically downward from the end of the first or front bottom panel 85 and terminates in a second or rear bottom panel 89 which is an elongated, generally rectangular, substantially planar, quartz panel.

A circular aperture 41 is formed in an intermediate portion of the second bottom panel 89. A hollow tubular element 91 depends vertically downward therefrom, and a shaft 49 depends vertically downward through the hollow interior 93 of the tube 91 along the longitudinal axis thereof. Purge gas is supplied to an inlet 95 in the tube 91 and the purge gas is supplied to the hollow interior 111 of the lower portion of the reactor 81 via the bottom circular aperture 41. The purge gas flow is shown by the purge gas flow direction arrows 97 and, the purge gas works exactly the same as the purge gas usage previously described with reference to the preferred embodiment of the reaction chamber 11 of the present invention. The shaft 49 is shown as supporting the pedestal 47 which in turn supports the susceptor 43 which demountably carries or positions the wafer 45 thereon. The bib or quartz panel 121 is shown as being disposed with its bottom surface 118 upon the interior top surfaces 117 of the first bottom panel 85 and located between the front end 19 and the susceptor 43. An extension portion 124 of the quartz plate 121 extends beyond the lip 61 of the junction of the intermediate end of the first lower panel 85 with the top of the vertical wall 88 such that the horizontal extension 124 overhangs the second bottom panel 89 and is substantially parallel thereto. This reduces or narrows the gap 125 between the curved rear end surface 127 of the plate 121 and a portion of the outer peripheral rim or circumference 59 of the susceptor 43, as previously described it will be seen that the height "$d_4$" of the rear end portion 23 of the chamber 81 is substantially equal to twice the verical height "$d_3$" measured between the interior surface 115 of the top panel 83 and the interior surface 117 of the first bottom panel 85 at the front end portion of the reactor 81. In addition to providing the necessary space for mounting the susceptor 43 the wafer 45 pedestal 47 and shaft 49, which could not otherwise be housed within the space between the top panel 83 and the first bottom panel 85, the dual height portion of the reaction chamber 81 at the rear end 23 provides adequate access space for installing the susceptor assembly and the plate 121, as desired.

Figure 10:
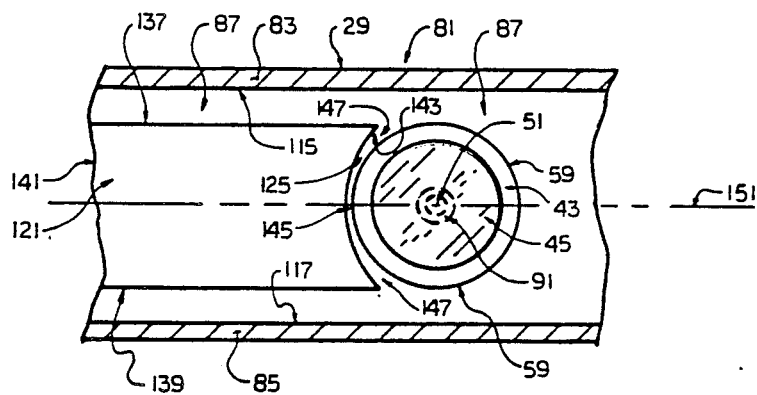
FIG. 10 is a top view taken along view line 10—10 of FIG. 5 and showing the relationship of the quartz plate to the susceptor.

FIG. 10 shows a sectional top view of a portion of the reaction chamber 81 of FIG. 9 illustrating the gap 125 between the inwardly curved end portion 127 of the plate extension 122 and the outer peripheral rim or circumference 59 of the susceptor 45. The plate 121 is again shown as having a rear end 141 and a pair of parallel sides 137, 139 which are generally perpendicular to the front end 141 and generally adjacent to the sides of the plate 121. The rear end portion 125 has an inwardly curved surface 143 which defines a narrow gap 145 between the inwardly curved surface 143 and the outer peripheral circumference 59 of the susceptor 45. The gap 125 is shown as including a relatively narrow center portion 145 disposed along the longitudinal axis 151, and the gap 145, 147 is shown as ever widening from the narrow central portion 145 to the widest gap portion 147 at the opposite ends of the gap 147. The inwardly curved surface 127 is shaped to provide this non-linear gap. It will be seen that a portion of the outer circumference 59 of the susceptor 43 is encircled within the inwardly curved portion forming the gap 125. Some portion less than 180° of the circumference of the susceptor 43 is so-encircled. The apparatus, instruction, operation and methodology of the dual height epitaxial deposition reaction chamber 81 of FIGS. 9 and 10 are substantially identical to that previously described, and will not be repeated herein. Anything previously described as an improvement on the reaction chamber 11 can be similarly applied to the reaction chamber 81 described herein.

As a parallel to the alternate embodiment of FIG. 10 to FIG. 9 a corresponding alternate embodiment exists to the structure of the dual height reaction chamber 81 of FIGS. 9 and 10 and it is indicated by the dotted horizontal extension 181 of the first bottom wall 85 extending horizontally beyond the lip 61 of the vertical wall 88 into and over the second portion of the reaction chamber 81 and the bottom 89 thereof. The extension 181 serves to replace the quartz plate 121, as previously described, and will not be further described herein.

In the preferred embodiment, the entire reaction chambers 11 and 81 have walls 13, 15 and sides 65 made of quartz or any suitable material which is transparent to the radiation used to heat the hollow interior of the reaction chamber 11, 81. Such chambers 11, 81 are typically referred to as "cold wall reactors". Typically, the material of the pedestal, the distending shaft, the elongated hollow tubular element, and the bib or plate 121 is also fused quartz.

The wafers to be processes are typically silicon semiconductor wafers, since epitaxial deposition is the deposition of a single crystal layer on a substrate (often, but not always, of the same composition as the deposited layer), such that the crystal structure of the layer is an extension of the crystal layer of the substrate. In this case, we can assume that a layer of silicon is being deposited into the surface of the silicon substrate or wafer to be processed.

the susceptor typically includes a graphite (carbon) body having a thin coating of silicon carbide over the outer surface thereof. The graphite is "susceptible" to being heated. The "flush" gas used at the beginning and end of each deposition, is a non-reactive gas, such as hydrogen and sometimes nitrogen, which is used top flush away unwanted gases from the reaction chamber. Prior to the reactor heat up, any residual air that may inadvertently have entered the chamber is removed by the flush process. A carrier gas such as hydrogen is used in the preferred embodiment of the present invention, although hellum may also be used. The gases used in almost all epitaxial depositions of silicon are compounds containing one silicon atom and four other atoms that are either chlorine or hydrogen or a combination of the two. The four most commonly used sources of silicon include Silane ($SiH_4$); Dichlorosilane ($SiH_2Cl_2$); Trichlorosilane ($SiHCl_3$) and Silicon Tetrachloride ($SiCl_4$). Similarly, the gases most commonly used to control the type of conductivity and the resistivity of the epitaxial layer must be compatible with the gases already present in the reaction chamber. These are referred to as dopant gases and the most commonly used include Arsine ($AsH_3$); Phosphine $PH_3$); and Diborane ($B_2H_6$).

It will be seen that in either the reduced area embodiment of the deposition reaction chamber 11 or in the dual height reaction chamber 81, that either the seperate quartz plate or bib can be used or a horizontal extension of the lower wall at the input end of the reaction chamber to narrow the gap between the outer peripheral rim of the susceptor and the inwardly curved end portion thereof.

Likewise, the system of the present invention can be used in any conventional epitaxial deposition operation although it is preferably used with the reaction chamber and susceptor positioning system disclosed and described in assignee's copending patent application, Ser. No. 032,474, filed on Mar. 31, 1987, and entitled ROTATABLE SUBSTRATE SUPPORTING MECHANISM WITH TEMPERATURE SENSING DEVICE FOR USE IN CHEMICAL VAPOR DEPOSITION EQUIPMENT, which is expressly incorporated by reference herein.

It will be noted that in order to optimize the spacing between the level of the susceptor with respect to the level of the bottom of the reactor, the shaft and pedestal supporting the susceptor can be selectively raised or lowered and finely tuned or adjusted for optimal performance of the system. Furthermore, the shaft can be rotated to rotate the susceptor and the wafer demountably carried thereon in order to average out imperfections in the deposition process and provide a truly uniform deposition on the surface of the wafer. In fact, the importance of shaping the velocity profile of the incoming reactant gases lies in the face that the velocity profile produced can be shaped to produce either a linear thickness distribution upstream-to-downstream or a truly uniform coating on the surface of the wafer. If the wafer is rotated, the linear deposition will be averaged out and a truly uniform deposition will result. Various features of the quartz plate, the narrowed gap, and the like, further tend to produce or shape the desired velocity profile to optimize the uniformity of the deposition.

The narrowing of the cross-sectional area of the reaction chamber which results, serves to greatly increases the velocity of the gas therethrough, reducing processing time, reducing wasted gas, and reducing the amount of gas required for performing the deposition process so that the process becomes much more efficient, especially for processing a single wafer on a one-at-a-time basis, as comtemplated by the system of the present invention.

It will be recognized, by those skilled in the art, that various modifications, variations, alterations, substitutions, and changes can be made in the structure, components, materials, and the like set forth in the preferred embodiments described herein without departing from the spirit and scope of the present invention, which is limited only by the appended claims.

We claim:

1. A method for processing a wafer within a reaction chamber, said method comprising in combination:
   a) receiving and exhausting a reactant gas through an inlet and an outlet, respectively, of the reaction chamber, which reaction chamber includes a bottom panel extending downstream of the inlet and terminating at a terminal edge;
   b) supporting the wafer upon a susceptor assembly, which susceptor assembly is downstream of the terminal edge of the bottom panel;
   c) locating the susceptor assembly in a wall disposed proximate the terminal edge of the bottom panel to prevent the susceptor assembly from being in the mainstream of reactant gas flow between the inlet and the outlet; and
   d) shaping the velocity profile of the flow of reactant gas flowing across the supported wafer to assist in carrying out the vapor deposition process more uniformly across the wafer, said step of shaping including the step of providing a varying flow rate of reactant gas through a gap, which gap is defined between the terminal edge and the adjacent susceptor assembly perimeter, and into the well, the gap being of a predetermined width at a central segment of the gap adjacent the susceptor assembly perimeter upstream of the center of the susceptor assembly and increasing in width in opposed directions along the terminal edge, the varying reactant gas flow rate having a first value at the central segment of the gap and ranging along the gap in opposed directions to a second value at the opposed extremities of the gap, whereby the velocity profile of the reactant gas flow laterally across the wafer supported on the susceptor assembly is a function of and modified by the reactant gas flow through the varying width gap upstream of the wafer.

2. The method for processing a wafer within a reaction chamber as set forth in claim 1, including the step of increasing the cross sectional area of the reaction chamber downstream of the susceptor assembly by a factor of two.

3. The method for processing a wafer within a reaction chamber as set forth in claim 2 including the step of accessing the wafer from a location downstream of the susceptor assembly.

* * * * *